US008552309B2

(12) United States Patent
Zen

(10) Patent No.: US 8,552,309 B2
(45) Date of Patent: Oct. 8, 2013

(54) WIRING DEVICE AND DISPLAY DEVICE

(75) Inventor: Tsu-Te Zen, Kaohsiung (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 99 days.

(21) Appl. No.: 13/227,485

(22) Filed: Sep. 8, 2011

(65) Prior Publication Data

US 2012/0314379 A1    Dec. 13, 2012

(30) Foreign Application Priority Data

Jun. 9, 2011  (TW) .............................. 100120093 A

(51) Int. Cl.
*H05K 1/11* (2006.01)

(52) U.S. Cl.
USPC ........... 174/261; 174/262; 174/255; 361/760; 361/777

(58) Field of Classification Search
USPC ................ 174/250, 255, 257, 260–262, 266; 349/73, 139, 149, 150–152; 361/760, 777, 361/807, 808
See application file for complete search history.

(56) References Cited

U.S. PATENT DOCUMENTS

| 6,980,268 | B2 | 12/2005 | You | |
|---|---|---|---|---|
| 7,507,996 | B2 * | 3/2009 | Hong et al. | 257/72 |
| 7,605,416 | B2 * | 10/2009 | Hong et al. | 257/293 |
| 8,106,309 | B2 * | 1/2012 | Hwang | 174/261 |
| 8,410,484 | B2 * | 4/2013 | Park et al. | 257/59 |
| 2001/0046016 | A1 * | 11/2001 | Park et al. | 349/139 |
| 2006/0011921 | A1 * | 1/2006 | Park et al. | 257/72 |
| 2007/0045516 | A1 * | 3/2007 | Hong | 250/208.1 |
| 2009/0219457 | A1 * | 9/2009 | Seo et al. | 349/55 |
| 2010/0231624 | A1 * | 9/2010 | Walmsley et al. | 347/12 |
| 2011/0199738 | A1 * | 8/2011 | Moriwaki | 361/748 |

FOREIGN PATENT DOCUMENTS

TW                561301        11/2003

* cited by examiner

*Primary Examiner* — Hoa C Nguyen
(74) *Attorney, Agent, or Firm* — Winston Hsu; Scott Margo

(57) ABSTRACT

A wiring device includes a main conductive line, a plurality of branch conductive lines, a passivation layer, a plurality of contact holes, a plurality of conductive patterns, and a plurality of outside device bonding regions. The branch conductive lines are electrically connected to the main conductive line. The passivation layer is disposed on the branch conductive lines. Each the contact hole partially exposes one of the branch conductive lines. The conductive patterns are disposed on the passivation layer, and each of the conductive patterns is disposed respectively corresponding to each of the branch conductive lines. Each of the conductive patterns is electrically connected to the corresponding branch conductive line via the contact holes. Each of the outside device bonding regions is disposed corresponding to each of the branch conductive lines. At least one of the outside device bonding regions does not overlap the contact hole in a vertical projective direction.

13 Claims, 11 Drawing Sheets

WIRING DEVICE AND DISPLAY DEVICE

BACKGROUND OF THE INVENTION

1. Field of the Invention

The present invention relates to a wiring device and a display device, and more particularly, to a iring device and a display device with a single conductive line partially replaced by a plurality of branch conductive lines and with at least a part of contact holes disposed out of outside device bonding regions.

2. Description of the Prior Art

In a conventional flat display panel, many wiring devices are disposed on a region around a display region of the display panel. Generally, the wiring devices have regions for bonding and being electrically connected to outside devices such as a driving IC or flexible printed circuits (FPC), and the regions may be called outside device bonding regions. The outside devices may be connected to the wiring devices at the outside device bonding regions, and signals may then be transferred between the outside devices and circuits on the display panel.

Please refer to FIG. 1A and FIG. 1B. FIG. 1A and FIG. 1B are schematic diagrams illustrating a conventional wiring device of a display device. FIG. 1A is a schematic diagram illustrating a top view of the wiring device, and FIG. 1B is a schematic diagram illustrating a cross-sectional view of the wiring device along the line C-C' in FIG. 1A. As shown in FIG. 1A and FIG. 1B, a wiring device 600 includes a conductive line 27, a conductive pattern 26, an insulating layer 22, a passivation layer 24, a plurality of contact holes 25, and a plurality of outside device bonding regions 28. The conductive line 27 is disposed on a substrate 20. The conductive line in the wiring device of the prior art may be formed by a single conductive layer or by multiple conductive layers. In this example, the conductive line is formed by two conductive layers, and an insulating layer is disposed between the conductive layers.

As shown in FIG. 1A and FIG. 1B, the conductive line 27 is formed by a first patterned conductive layer 21 and a second patterned conductive layer 23. The insulating layer 22 is disposed between the first patterned conductive layer 21 and the second patterned conductive layer 23. The second patterned conductive layer 23 is disposed over the first patterned conductive layer 21. The passivation layer 24 is disposed on the first patterned conductive layer 21, the second patterned conductive layer 23, and the insulating layer 22. Each of the contact holes 25 partially exposes the first patterned conductive layer 21 or partially exposes the second patterned conductive layer 23. The conductive pattern 26 contacts the first patterned conductive layer 21 and the second patterned conductive layer 23 via the contact holes 25. Therefore, the first patterned conductive layer 21 may be electrically connected to the second patterned conductive layer 23 by the conductive pattern 26. Generally, the first patterned conductive layer 21 and the second patterned conductive layer 23 are formed by metal materials with low electrical resistivity, and the conductive pattern 26 is formed by transparent conductive materials such as indium tin oxide (ITO). It is worth noticing that in conventional wiring devices of a display device, outside device bonding regions are disposed on regions with contact holes.

As shown in FIG. 1A and FIG. 1B, the outside device bonding regions 28 overlap the contact holes 25 in a vertical projective direction Z. Outside devices (not shown) may then contact the conductive line 27 directly, and issues such as those that may be generated by the conductive pattern 26 with higher resistivity, may then be improved. The outside devices may be electrically connected to the conductive line 27 more effectively. However, in the ordinary bonding process, components of the outside device such as a connecting pin of a driving IC may damage the conductive pattern 26 and partially expose the conductive line 27 especially when conditions of the bonding process are not well-controlled. Therefore, problems such as electrical corrosion may be generated on the conductive line 27 near the outside device bonding region 28 when higher current or voltage is inputted from the outside device to the wiring device 600, and the performance of the wiring device and the reliability of the display device may be seriously affected.

SUMMARY OF THE INVENTION

It is one of the objectives of the present invention to provide a wiring device and a display device for improving the electrical corrosion issue at the wiring device of the display device.

To achieve the purposes described above, a preferred embodiment of the present invention provides a wiring device disposed on a substrate. The wiring device includes at least one main conductive line, a plurality of branch conductive lines, a passivation layer, a plurality of contact holes, a plurality of conductive patterns, and a plurality of outside device bonding regions. The main conductive line is disposed on the substrate. The branch conductive lines are disposed on the substrate, and each of the branch conductive lines is electrically connected to the main conductive line. The passivation layer is disposed on the branch conductive lines. The contact holes partially expose each of the branch conductive lines in an at least one contact hole to one branch conductive line correspondence. The conductive patterns are disposed on the passivation layer, and each of the conductive patterns is disposed respectively corresponding to each of the branch conductive lines. Each of the conductive patterns is electrically connected to the corresponding branch conductive line via the contact holes. Each of the outside device bonding regions is disposed uniquely corresponding to one of the branch conductive lines, and at least one of the outside device bonding regions does not overlap in a vertical projective direction at least one of the at least one contact hole corresponding to the corresponding branch conductive line.

To achieve the purposes described above, a preferred embodiment of the present invention provides a display device. The display device includes a display region, a peripheral region, and at least a wiring device. The peripheral region is disposed on at least one side of the display region. The wiring device is disposed in the peripheral region. The wiring device includes at least one main conductive line, a plurality of branch conductive lines, a passivation layer, a plurality of contact holes, a plurality of conductive patterns, and a plurality of outside device bonding regions. The main conductive line is disposed on the substrate. The branch conductive lines are disposed on the substrate, and each of the branch conductive lines is electrically connected to the main conductive line. The passivation layer is disposed on the branch conductive lines. The contact holes partially expose each of the branch conductive lines in an at least one contact hole to one branch conductive line correspondence. The conductive patterns are disposed on the passivation layer, and each of the conductive patterns is disposed respectively corresponding to each of the branch conductive lines. Each of the conductive patterns is electrically connected to the corresponding branch conductive line via the contact holes. Each of the outside device bonding regions is disposed uniquely corresponding to one of the branch conductive lines, and at least one of the outside device bonding regions does not overlap in a vertical projective direction at least one of the at least one contact hole corresponding to the corresponding branch conductive line.

In the present invention, a part of the single conductive line is replaced by a plurality of branch conductive lines, and at least some of the contact holes are disposed out of the outside device bonding regions. The electrical corrosion issue at the outside device bonding regions may then be improved, the wiring device of the display device may work normally, and the reliability of the display device may then be enhanced.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
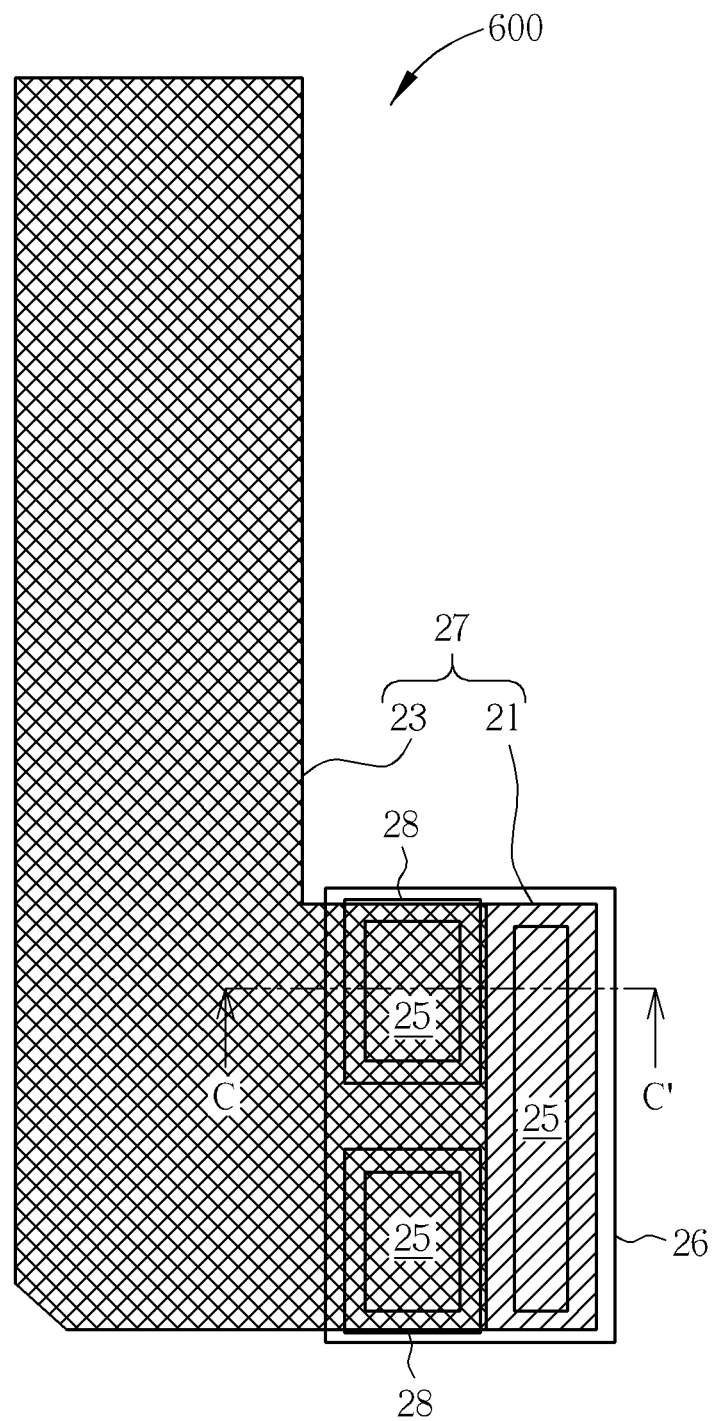
FIG. 1A and FIG. 1B are schematic diagrams illustrating a conventional wiring device of a display device.
Figure 1B:
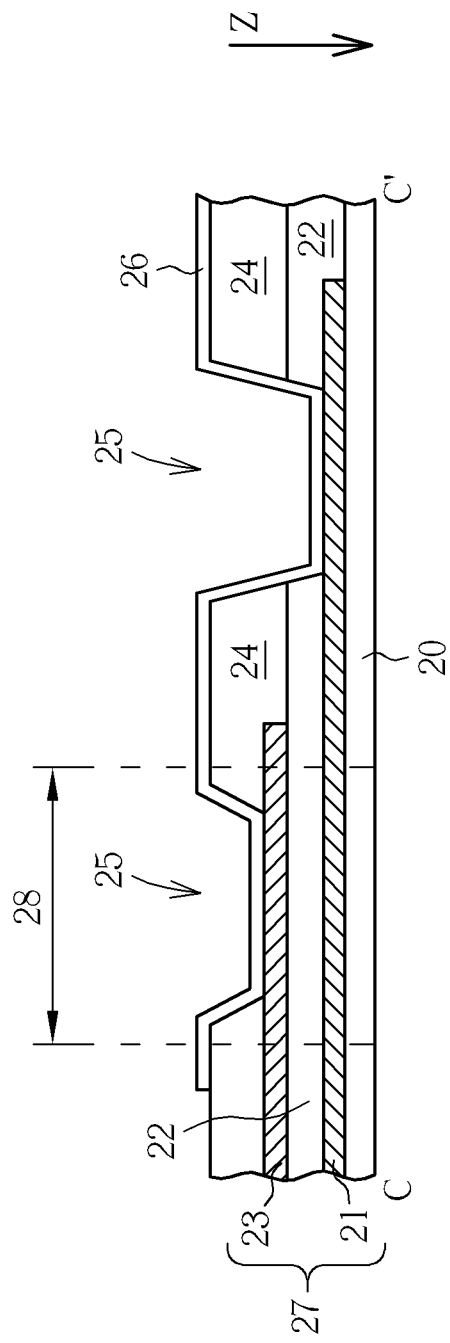
Figure 2:
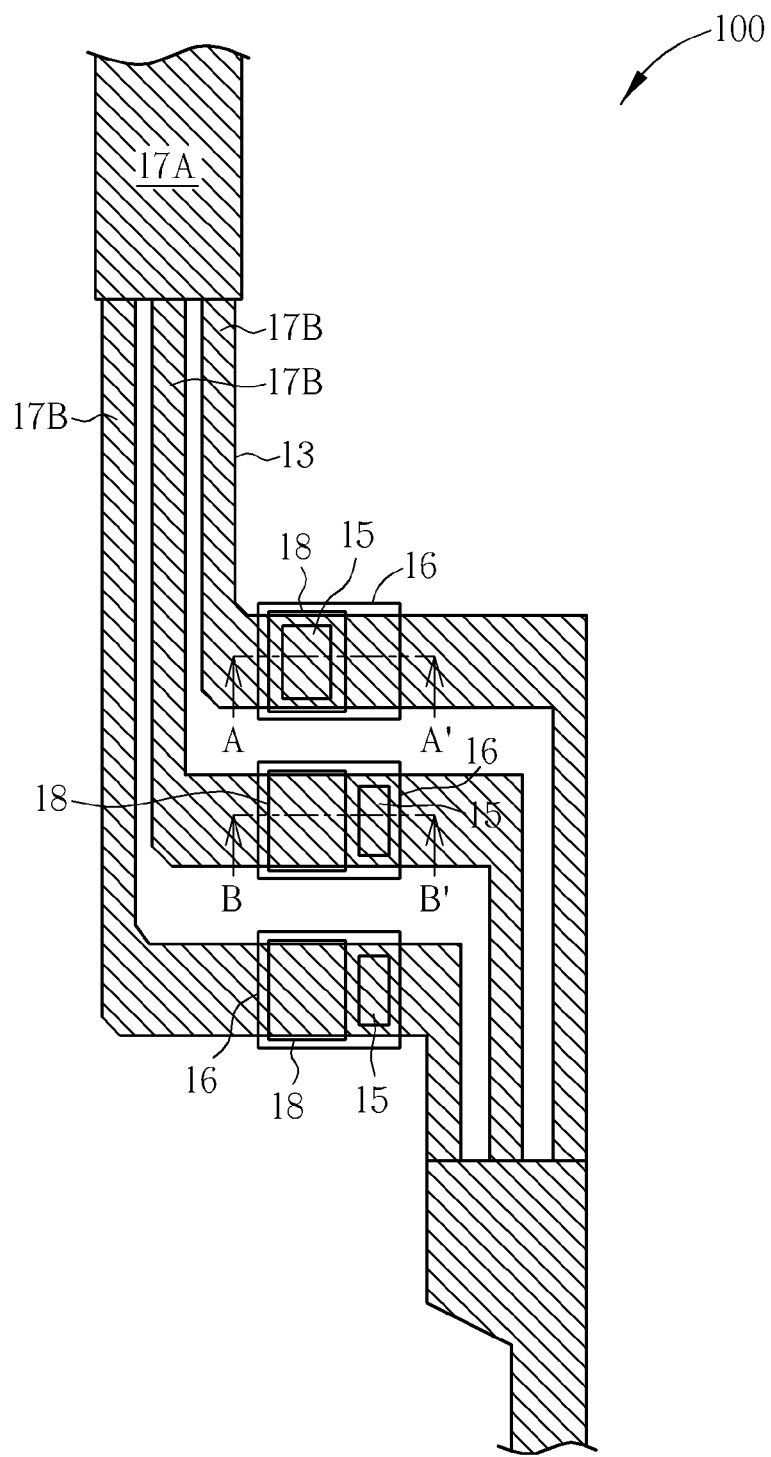
FIG. 2 is a schematic diagram illustrating a top view of a wiring device according to a first preferred embodiment of the present invention.
Figure 3:
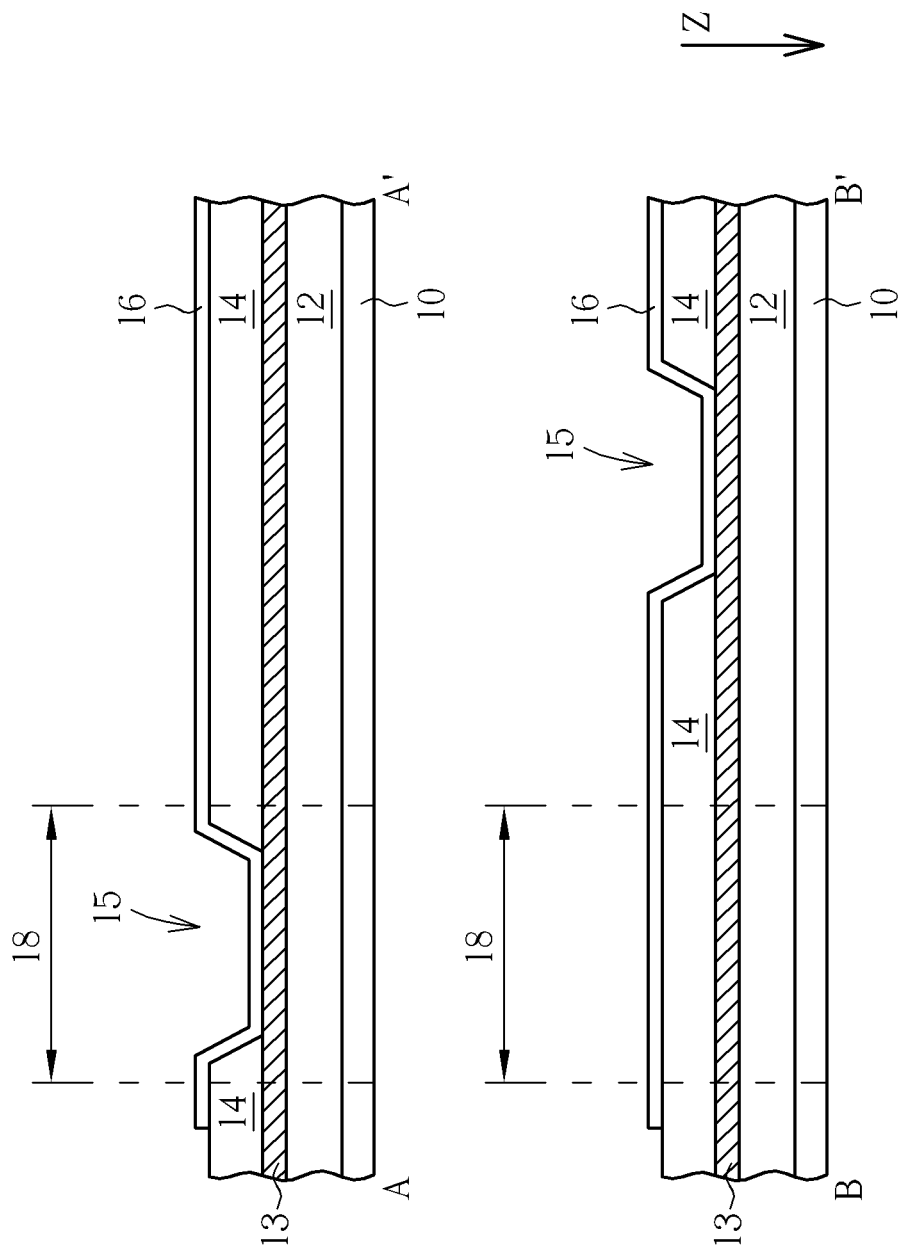
FIG. 3 is a schematic diagram illustrating a cross-sectional view of the wiring device along the line A-A' and the line B-B' in FIG. 2.

Please refer to FIG. 2 and FIG. 3. FIG. 2 is a schematic diagram illustrating a top view of a wiring device according to a first preferred embodiment of the present invention. FIG. 3 is a schematic diagram illustrating a cross-sectional view of the wiring device along the line A-A' and the line B-B' in FIG. 2. Please note that the figures are only for illustration and the figures may not be to scale. The scale may be further modified according to different design considerations. As shown in FIG. 2 and FIG. 3, in this embodiment, a wiring device 100 is disposed on a substrate 10. The wiring device 100 includes at least one main conductive line 17A, a plurality of branch conductive lines 17B, a passivation layer 14, a plurality of contact holes 15, a plurality of conductive patterns 16, and a plurality of outside device bonding regions 18. The main conductive line 17A and the branch conductive lines 17B are disposed on the substrate 10. The wiring device 100 in this embodiment includes three branch conductive lines 17B, but the present invention is not limited to this. Each of the branch conductive lines 17B is electrically connected to the main conductive line 17A. In this embodiment, the main conductive line 17A and the branch conductive lines 17B are formed by a second patterned conductive layer 13 for being electrically connected to each other, but the present invention is not limited to this and the main conductive line 17A and the branch conductive lines 17B may be formed separately and electrically connected by direct contact or by connecting bridges. Additionally, in the present invention, the second patterned conductive layer 13 may preferably include metal materials such as at least one of aluminum (Al), copper (Cu), silver (Ag), chromium (Cr), titanium (Ti), and molybdenum (Mo), a composite layer of the above-mentioned materials, or an alloy of the above-mentioned materials, but the second patterned conductive layer 13 is not limited to this and may include other conductive materials.

In this embodiment, the wiring device 100 may further include an insulating layer 12 disposed between the second patterned conductive layer 13 and the substrate 10, but not limited thereto. In addition, the passivation layer 14 is disposed on the branch conductive lines 17B, and each of the contact holes 15 partially exposes each of the branch conductive lines 17B. Accordingly, the contact holes 15 partially expose each of the branch conductive lines 17B in an at least one contact hole 15 to one branch conductive line 17B correspondence. In other words, the contact holes 15 in this embodiment partially expose the second patterned conductive layer 13. The conductive patterns 16 are disposed on the passivation layer 14, and each of the conductive patterns 16 is disposed respectively corresponding to each of the branch conductive lines 17B. Each of the conductive patterns 16 is electrically connected to the corresponding branch conductive line 17B via the contact holes 15. In this embodiment, the conductive patterns 16 may include transparent conductive patterns, and materials of the conductive patterns 16 may include materials such as indium tin oxide (ITO), but the conductive pattern 16 is not limited to this and may be formed by other non-transparent conductive materials or transparent conductive materials.

In this embodiment, each of the outside device bonding regions 18 is disposed corresponding to each of the branch conductive lines 17B, and at least one of the outside device bonding regions 18 does not overlap the contact hole 15 in a vertical projective direction Z. In other words, each of the outside device bonding regions 18 is disposed uniquely corresponding to one of the branch conductive lines 17B, and at least one of the outside device bonding regions 18 does not overlap in the vertical projective direction Z at least one of the at least one contact hole 15 corresponding to the corresponding branch conductive line 17B. In addition, in this embodiment, at least one of the outside device bonding regions 18 overlaps in the vertical projective direction Z at least one of the at least one contact hole 15 corresponding to the corresponding branch conductive line 17B. As shown in FIG. 2 and FIG. 3, the wiring device 100 of this embodiment includes three branch conductive lines 17B, two of the outside device bonding regions 18 on the corresponding branch conductive lines 17B do not overlap the contact holes 15 in the vertical projective direction Z, and one of the outside device bonding regions 18 on the corresponding branch conductive lines 17B overlaps the contact hole 15 in the vertical projective direction Z, but the present invention is not limited to this and all of the outside device bonding regions 18 on the corresponding branch conductive lines 17B may not overlap the contact hole 15 in the vertical projective direction Z. Specifically, according to a structure that the outside device bonding regions 18 do not overlap the contact holes 15, outside devices (not shown) are electrically connected to the branch conductive lines 17B by contacting the conductive patterns 16, and a probability of electrical corrosions generated at the outside device bonding regions 18 may then be lowered. Additionally, according to a structure that the outside device bonding region 18 overlaps the contact hole 15, the outside devices may directly contact the branch conductive lines 17B more likely, and the outside devices may be electrically connected to the branch conductive lines 17B more effectively. Therefore, according to the structure of the wiring device 100 in this embodiment, the probability and the influence of the electrical corrosion may be lowered, and the outside devices may also effectively be electrically connected to the wiring device 100.

It is worth noticing that each of the outside device bonding regions 18 may be a region designed for being connected to the outside devices on the wiring device 100. However, actual positions where the outside devices are connected to the wiring device may be shifted by the influence of the positioning accuracy of the bonding procedure. Therefore, the outside device bonding regions 18 of the present invention may also be regarded as regions where the outside device actually contacts the wiring device 100. In addition, the conductive patterns 16 in this embodiment are separated from each other, and electrical corrosion generated on one of the branch conductive lines 17B may then be isolated from the adjacent branch conductive lines 17B, but the present invention is not limited to this and some of the conductive patterns 16, such as the conductive patterns 16 corresponding to the outside device bonding regions 18 which do not overlap the contact holes 15, may be connected to each other, and the outside devices may therefore be electrically connected to the branch conductive lines 17B more effectively. Additionally, in this embodiment, the spacing between each of the branch conductive lines 17B and the distance between each of the outside device bonding regions 18 and the main conductive line 17A may be modified for further lowering the probability and the influence of the electrical corrosion.

Figure 4:
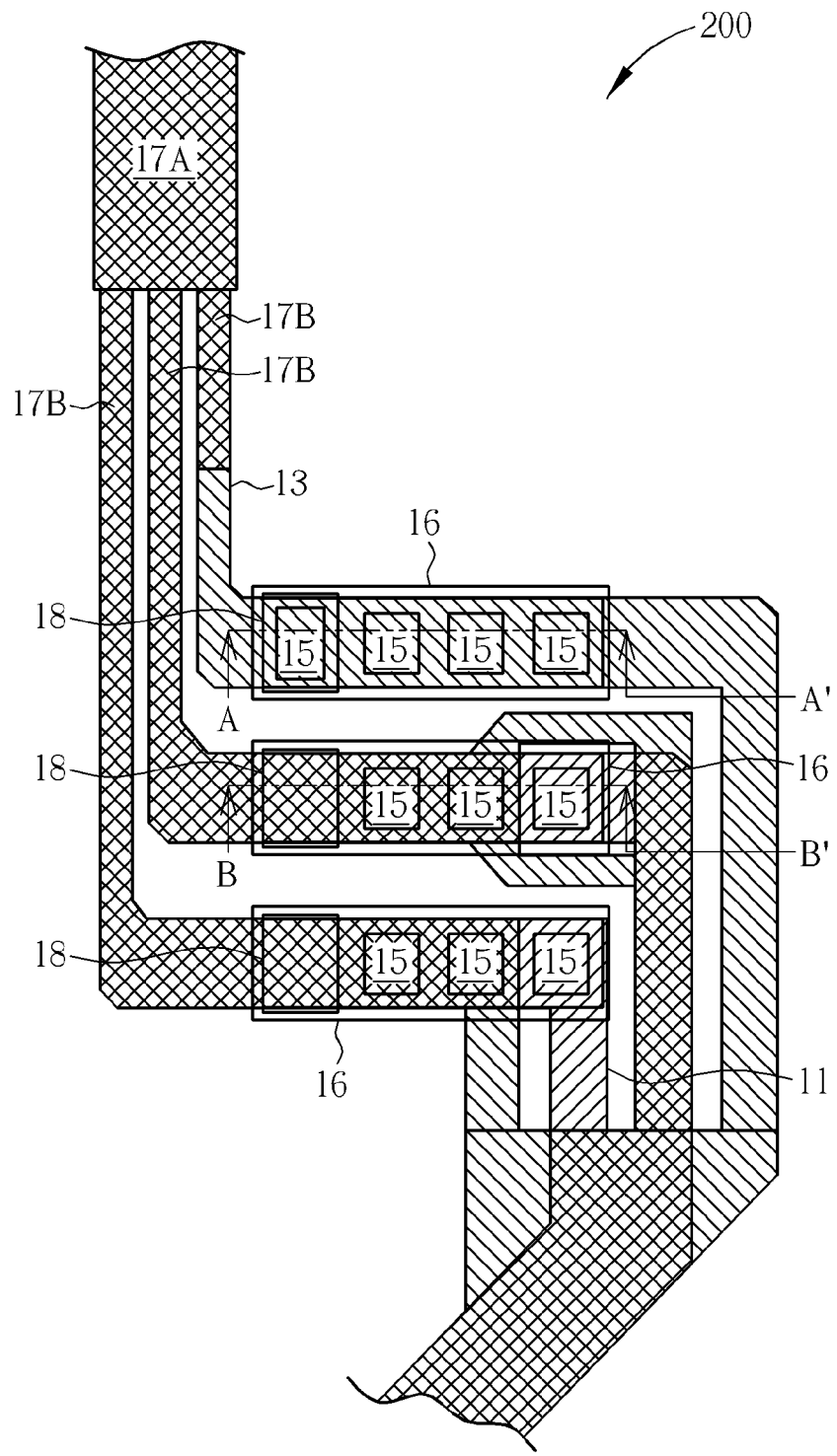
FIG. 4 is a schematic diagram illustrating a top view of a wiring device according to a second preferred embodiment of the present invention.
Figure 5:
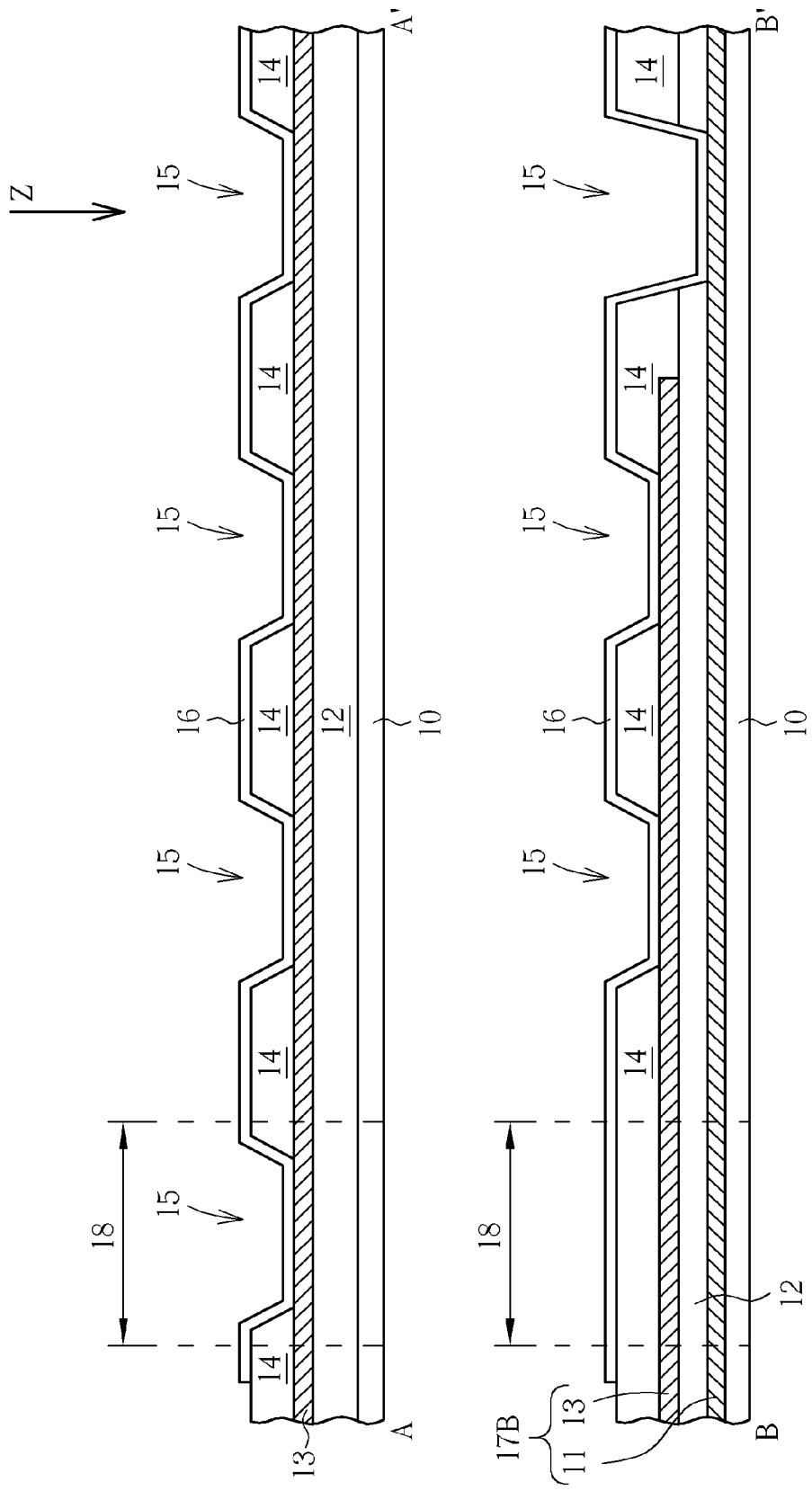
FIG. 5 is a schematic diagram illustrating a cross-sectional view of the wiring device along the line A-A' and the line B-B' in FIG. 4.

Please refer to FIG. 4 and FIG. 5. FIG. 4 is a schematic diagram illustrating a top view of a wiring device according to a second preferred embodiment of the present invention. FIG. 5 is a schematic diagram illustrating a cross-sectional view of the wiring device along the line A-A' and the line B-B' in FIG. 4. As shown in FIG. 4 and FIG. 5, differences between a wiring device 200 of this embodiment and the wiring device 100 of the first preferred embodiment are listed below. First of all, in this embodiment, the main conductive line 17A and the branch conductive lines 17B are formed by a first patterned conductive layer 11 and a second patterned conductive layer 13. The insulating layer 12 is disposed between the first conductive layer 11 and the second conductive layer 13. In the present invention, the first patterned conductive layer 11 may preferably include metal materials such as at least one of aluminum (Al), copper (Cu), silver (Ag), chromium (Cr), titanium (Ti), and molybdenum (Mo), a composite layer of the above-mentioned materials, or an alloy of the above-mentioned materials, but the first patterned conductive layer 11 is not limited to this and may include other conductive materials.

In this embodiment, at least one of the contact holes 15 partially exposes the first patterned conductive layer 11, and at least one of the contact holes 15 partially exposes the second patterned conductive layer 13. In addition, the first patterned conductive layer 11 and the second patterned conductive layer 13 of at least one of the branch conductive lines 17B are electrically connected to the conductive pattern 16 via the contact holes 15. It is worth noticing that the wiring device 200 of this embodiment includes three branch conductive lines 17B, but not limited thereto. Two of the outside device bonding regions 18 on the corresponding branch conductive lines 17B do not overlap the contact holes 15 in the vertical projective direction Z, and one of the outside device bonding regions 18 on the corresponding branch conductive lines 17B overlaps the contact hole 15 in the vertical projective direction Z.

In this embodiment, the contact hole 15 overlapping the outside device bonding region 18 partially exposes the second patterned conductive layer 13, and the contact holes 15, which are corresponding to the branch conductive lines 17B where the outside device bonding regions 18 do not overlap the contact holes 15 in the vertical projective direction Z, partially expose the first patterned conductive layer 11 and the second patterned conductive layer 13 of each of the corresponding branch conductive lines 17B. In other words, according to the structure of the branch conductive lines 17B of the wiring device 200 and the relative allocation design of the outside device bonding regions 18 and the contact holes 15, signals being transmitted from outside devices to the wiring device 200 may selectively pass through the first patterned conductive layer 11 and/or the second patterned conductive layer 13 for being connected to the main conductive line 17A, and the condition of the electrical connection may then be improved. Except for the fact that the structure of the contact holes 15 has to be adjusted according to the branch conductive lines 17B made of the first patterned conductive layer 11 and the second patterned conductive layer 13, the characteristics and the material properties of the components in this embodiment are similar to the first preferred embodiment and will not be redundantly described. Additionally, it is worth noticing that size, numbers and shapes of contact holes on each of the branch conductive lines 17B may also be modified for improving the condition of the electrical connection between the outside devices and the wiring device 200 in the present invention.

Figure 6:
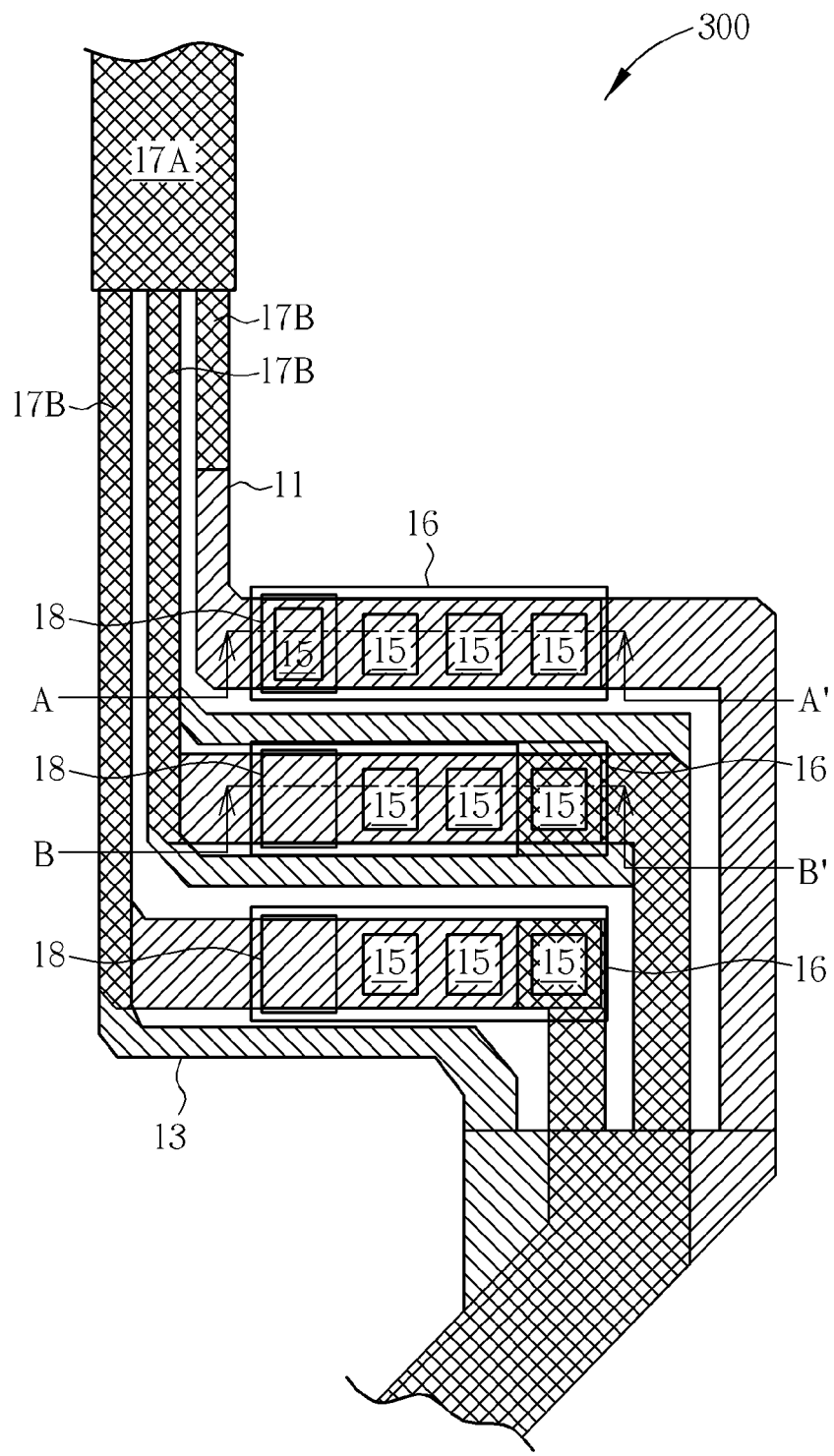
FIG. 6 is a schematic diagram illustrating a top view of a wiring device according to a third preferred embodiment of the present invention.
Figure 7:
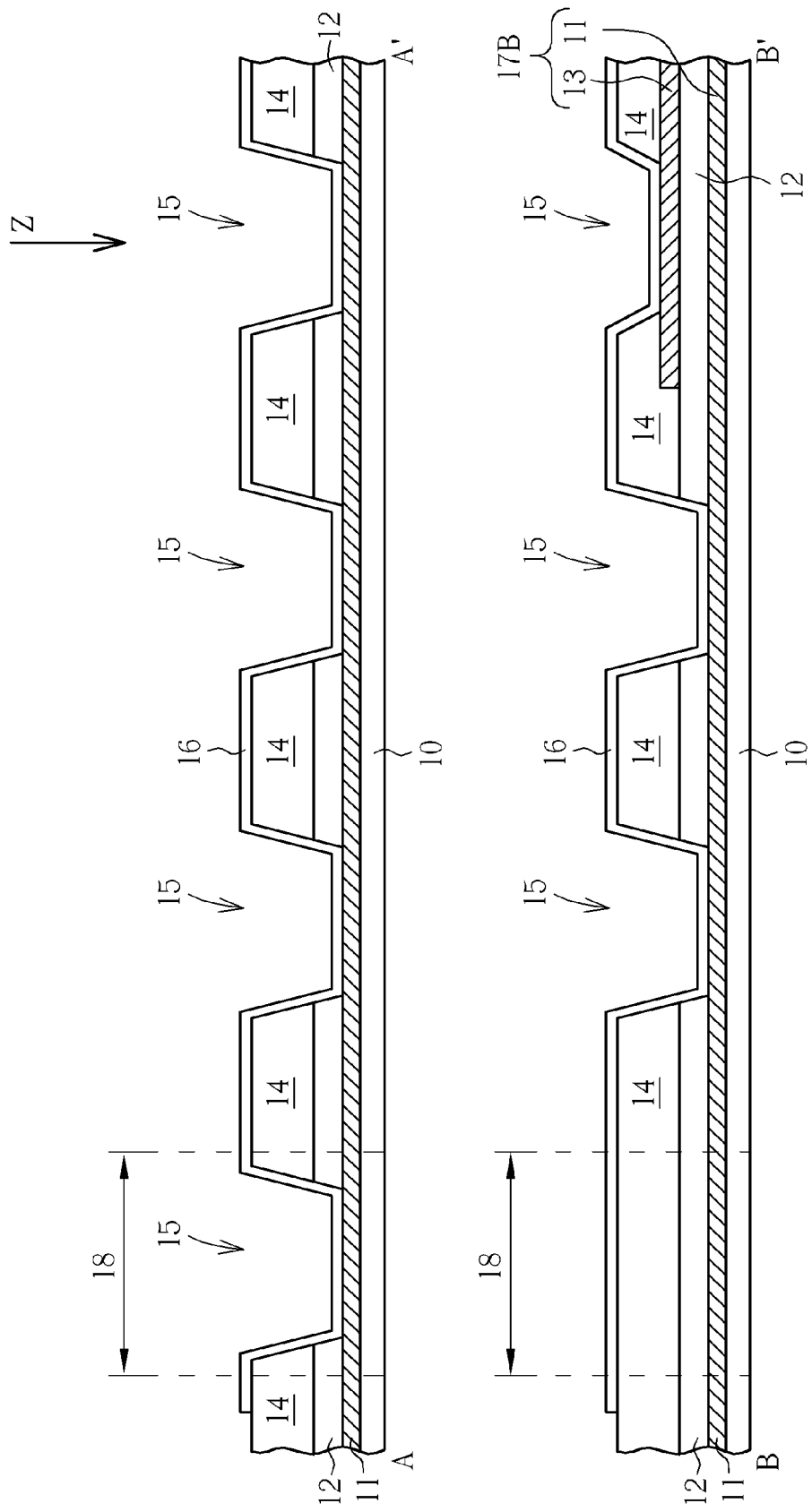
FIG. 7 is a schematic diagram illustrating a cross-sectional view of the wiring device along the line A-A' and the line B-B' in FIG. 6.

Please refer to FIG. 6 and FIG. 7. FIG. 6 is a schematic diagram illustrating a top view of a wiring device according to a third preferred embodiment of the present invention. FIG. 7 is a schematic diagram illustrating a cross-sectional view of the wiring device along the line A-A' and the line B-B' in FIG. 6. As shown in FIG. 6 and FIG. 7, the difference between a wiring device 300 of this embodiment and the wiring device 200 of the second preferred embodiment is that, in this embodiment, the contact hole 15 overlapping the outside device bonding region 18 partially exposes the first patterned conductive layer 11. In other words, the outside device may be electrically connected to the main conductive line 17A mainly via the first patterned conductive layer 11 of the branch conductive line 17B where the outside device bonding region 18 overlaps the contact hole 15. In the second preferred embodiment detailed above, the outside device may be electrically connected to the main conductive line 17A mainly via the second patterned conductive layer 13 of the branch conductive line 17B where the outside device bonding region 18 overlaps the contact hole 15. Therefore, the structure and the design of the wiring device may be modified depending on the second preferred embodiment or the third preferred embodiment especially when the resistivity difference between the first patterned conductive layer 11 and the second conductive layer 13 is obvious or the anti-corrosion properties of the first patterned conductive layer 11 and the second conductive layer 13 are different.

Figure 8:
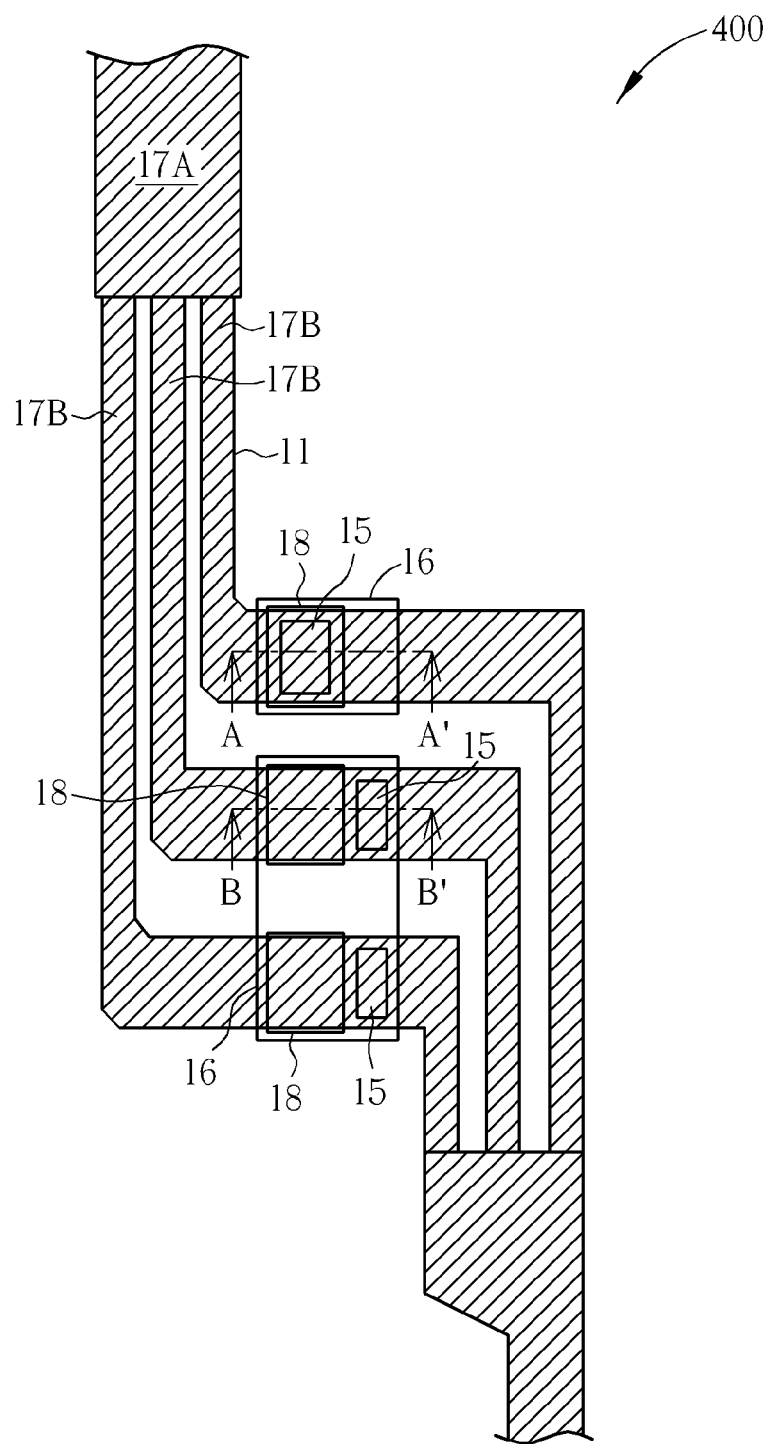
FIG. 8 is a schematic diagram illustrating a top view of a wiring device according to a fourth preferred embodiment of the present invention.
Figure 9:
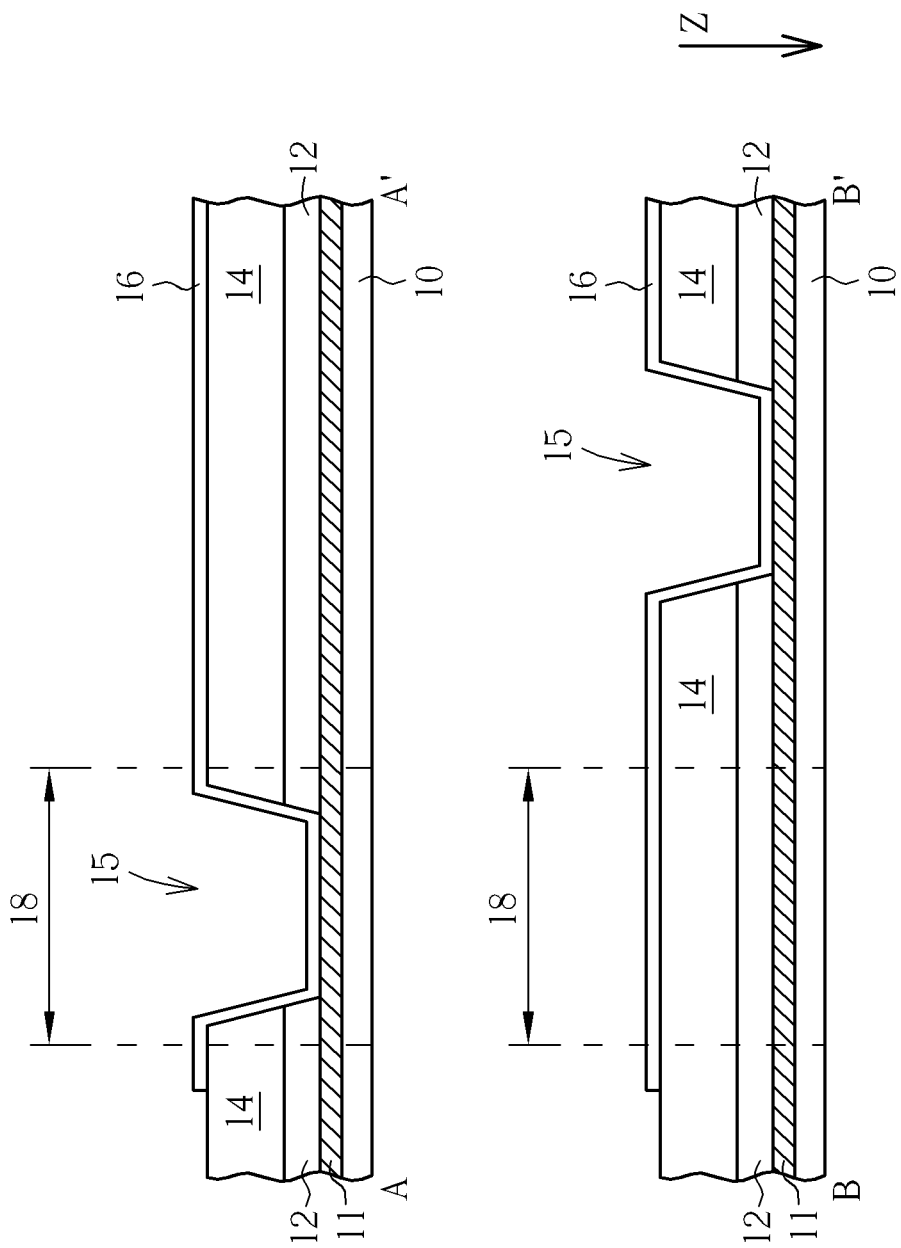
FIG. 9 is a schematic diagram illustrating a cross-sectional view of the wiring device along the line A-A' and the line B-B' in FIG. 8.

Please refer to FIG. 8 and FIG. 9. FIG. 8 is a schematic diagram illustrating a top view of a wiring device according to a fourth preferred embodiment of the present invention. FIG. 9 is a schematic diagram illustrating a cross-sectional view of the wiring device along the line A-A' and the line B-B' in FIG. 8. As shown in FIG. 8 and FIG. 9, differences between a wiring device 400 of this embodiment and the wiring device 100 of the first preferred embodiment are listed below. First of all, in this embodiment, the main conductive line 17A and the branch conductive lines 17B are formed by a first patterned conductive layer 11. The insulating layer 12 is disposed between the first patterned conductive lines 17B and the passivation layer 14, but the present invention is not limited to this and there may be only one single passivation layer disposed between the first patterned conductive layer 11 and the conductive pattern 16. In addition, each of the contact holes 15 of this embodiment partially exposes the first patterned conductive layer 11 because the branch conductive lines 17B are formed by the first patterned conductive layer 11.

Except for the fact that the structure of the contact holes 15 has to be adjusted according to the branch conductive lines 17B made of the first patterned conductive layer 11, the characteristics and the material properties of the components in this embodiment are similar to the first preferred embodiment and will not be redundantly described. As shown in FIG. 8, the conductive patterns 16 corresponding to the outside device bonding regions 18, which do not overlap the contact holes 15, may be connected to each other, and the outside devices may therefore be electrically connected to the branch conductive lines 17B more effectively, but the present invention is not limited to this and the conductive patterns 16 may be separated from each other according to different requirements.

Figure 10:
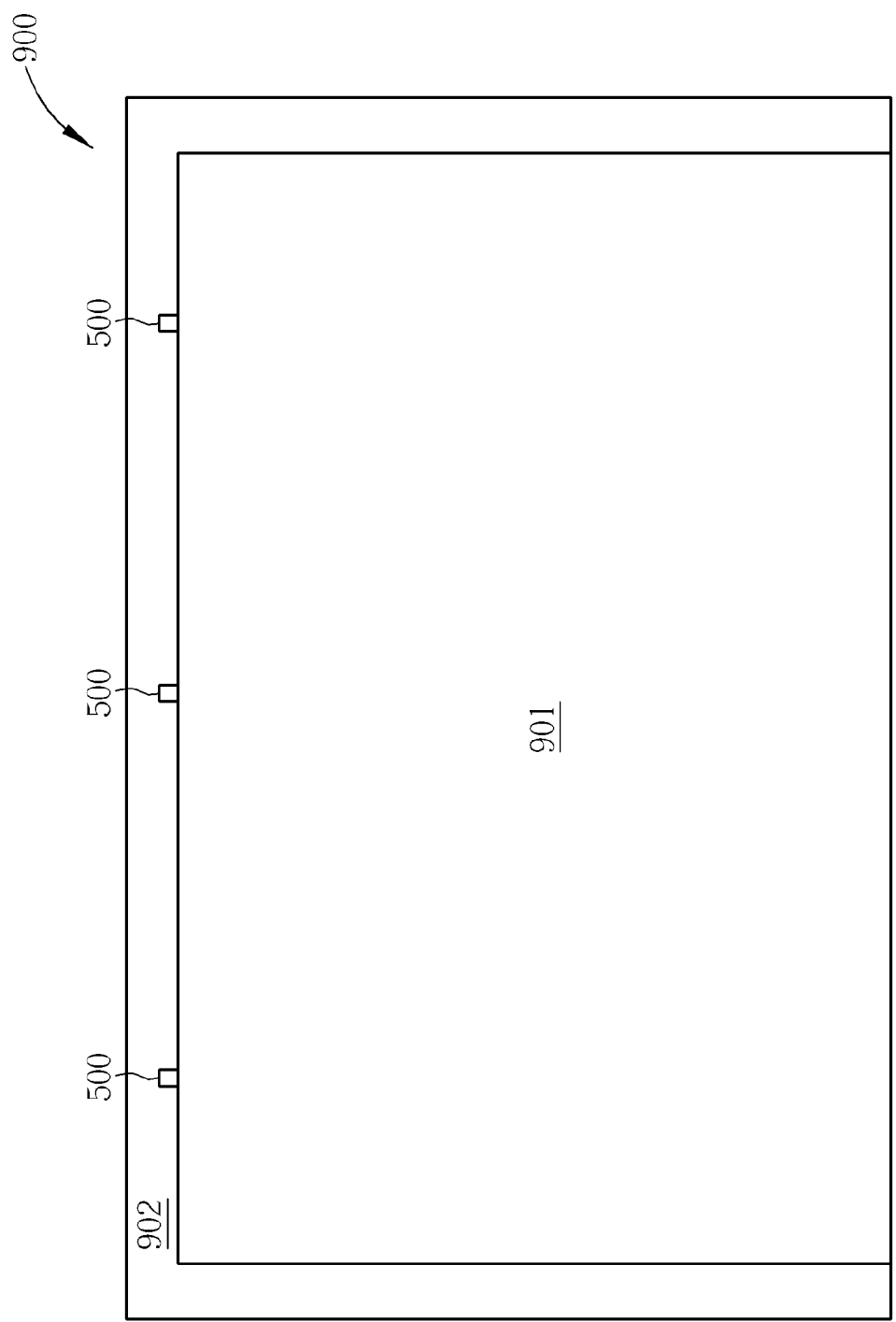
FIG. 10 is a schematic diagram illustrating a top view of a display device according to another preferred embodiment of the present invention.

Please refer to FIG. 10. FIG. 10 is a schematic diagram illustrating a top view of a display device according to another preferred embodiment of the present invention. Please note that the figures are only for illustration and the figures may not be to scale. The scale may be further modified according to different design considerations. As shown in FIG. 10, in this embodiment, a display device 900 includes a display region 901, a peripheral region 902, and at least a wiring device 500. The peripheral region 902 is disposed on at least one side of the display region 901. The wiring device 500 is disposed in the peripheral region 902. The wiring device 500 of this embodiment may be similar to the wiring device 100, the wiring device 200, the wiring device 300, or the wiring device 400 mentioned above. In other words, each of the wiring devices 500 in the display device 900 may be chosen from or be modified according to any or all of the preferred embodiments described above, and the wiring devices 500 in the display device 900 may be identical or different from each other depending on different purposes such as improving anti-corrosion properties or enhancing the condition of electrical connections. The display device 900 in this embodiment may include a liquid crystal display device, an electroluminescence display device, an electrowetting display device, an E-paper display device, and a touch display device, but not limited thereto.

To summarize the above descriptions, in the present invention, a part of the conventional single conductive line is replaced by a plurality of branch conductive lines, and at least some of the contact holes are disposed away from the outside device bonding regions. The probability of the electrical corrosion generated at the outside device bonding regions may then be lowered, the influence of the electrical corrosion on the wiring device and the display device may then be reduced, and the reliability of the display device may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wiring device, disposed on a substrate, the wiring device comprising:
   at least one main conductive line, disposed on the substrate;
   a plurality of branch conductive lines, disposed on the substrate, wherein each of the branch conductive lines is electrically connected to the main conductive line;
   a passivation layer, disposed on the branch conductive lines;
   a plurality of contact holes partially exposing each of the branch conductive lines in an at least one contact hole to one branch conductive line correspondence;
   a plurality of conductive patterns, disposed on the passivation layer, wherein each of the conductive patterns is disposed respectively corresponding to each of the branch conductive lines, and each of the conductive patterns is electrically connected to the corresponding branch conductive line via the contact holes; and
   a plurality of outside device bonding regions, each of the outside device bonding regions disposed uniquely corresponding to one of the branch conductive lines, wherein at least one of the outside device bonding regions does not overlap any one of the contact holes in a vertical projective direction.

2. The wiring device of claim 1, wherein at least one of the outside device bonding regions overlaps in the vertical projective direction at least one of the at least one contact hole corresponding to the corresponding branch conductive line.

3. The wiring device of claim 1, wherein the main conductive line and the branch conductive lines are formed by a first patterned conductive layer, and each of the contact holes partially exposes the first patterned conductive layer.

4. The wiring device of claim 2, wherein the main conductive line and the branch conductive lines are formed by a first patterned conductive layer and a second patterned conductive layer, at least one of the contact holes partially exposes the first patterned conductive layer, and at least one of the contact holes partially exposes the second patterned conductive layer.

5. The wiring device of claim 4, wherein the first patterned conductive layer and the second patterned conductive layer of at least one of the branch conductive lines are electrically connected to the conductive pattern via the contact holes.

6. The wiring device of claim 4, wherein the contact hole overlapped by the outside device bonding region partially exposes the first patterned conductive layer.

7. The wiring device of claim 4, wherein the contact hole overlapped by the outside device bonding region partially exposes the second patterned conductive layer.

8. The wiring device of claim 1, wherein the main conductive layer and the branch conductive layer are formed by a second patterned conductive layer, and the contact holes partially expose the second patterned conductive layer.

9. The wiring device of claim 1, wherein the conductive patterns include transparent conductive patterns.

10. The wiring device of claim 1, wherein the conductive patterns are separated from each other.

11. The wiring device of claim 1, wherein at least a part of the conductive patterns are connected to each other.

12. A display device, comprising:
    a display region and a peripheral region, wherein the peripheral region is disposed on at least one side of the display region; and at least one wiring device of claim 1, disposed in the peripheral region.

13. The display device of claim 12, wherein at least one of the outside device bonding regions overlaps in the vertical projective direction at least one of the at least one contact hole corresponding to the corresponding branch conductive line.

* * * * *